United States Patent [19]

Kimura

[11] Patent Number: 5,355,534
[45] Date of Patent: Oct. 11, 1994

[54] FREQUENCY MIXING CIRCUIT HAVING AUTOMATIC GAIN CONTROL FUNCTION

[75] Inventor: Katsuji Kimura, Tokyo, Japan
[73] Assignee: NEC Corporation, Tokyo, Japan
[21] Appl. No.: 989,548
[22] Filed: Dec. 11, 1992
[30] Foreign Application Priority Data Dec. 12, 1991 [JP] Japan .................. 3-351434

[51] Int. Cl.[5] .............. H04B 1/28; H03B 19/06
[52] U.S. Cl. ................... 455/323; 455/333; 455/251.1; 307/529
[58] Field of Search ............ 455/323, 325, 326, 330, 455/333, 318, 319, 320, 250.1, 251.1; 307/254, 529, 360

[56] References Cited

U.S. PATENT DOCUMENTS 4,704,738 11/1987 Graziadei et al. ............ 455/333

Primary Examiner—Reinhard J. Eisenzopf
Assistant Examiner—Thanh C. Le
Attorney, Agent, or Firm—Burns, Doane, Swecker & Mathis

[57] ABSTRACT

A frequency mixing circuit which comprises first to fourth unbalanced differential pairs each composed of two transistors whose emitter are ratio is K:1 (K>1), and first to fourth transistors each for driving the pairs. In the pairs, the collectors of the transistors smaller in emitter area are connected, and the collectors of the transistors larger in emitter area are connected to form an output terminals pair. In the first and second pairs, the bases of the transistors having each smaller and larger emitter areas are connected to form a first input terminals pair. In the third and fourth pairs, the bases of the transistors having each smaller and larger emitter areas are connected to form a second input terminals pair. The respective one terminals of the first and second input terminals pairs are connected to be applied with a signal voltage VRF. The respective other terminals of the first and second input terminals pairs are respectively applied with voltages $\pm(\frac{1}{2})$VAGC. The bases of the first to fourth transistors are applied with a signal voltage VLO. Wide range AGC function can be provided stably.

14 Claims, 3 Drawing Sheets

FREQUENCY MIXING CIRCUIT HAVING AUTOMATIC GAIN CONTROL FUNCTION

BACKGROUND OF THE INVENTION

1. Field of the Invention

This invention relates to a frequency mixing circuit having an automatic gain control (AGC) function.

2. Description of the Prior Art

In a general radio unit, a frequency mixing circuit capable of controlling a gain automatically is used and, for example, a circuit as shown in FIG. 1 is conventionally known to be used for this purpose. FIG. 1 shows a frequency mixing circuit using a dual gate field effect transistor (FET) Q22, an RF amplifier disposed in the preceding stage thereof and using an FET Q21, and a local oscillator using a bipolar transistor Q23. An RF signal VRF inputted from an antenna is amplified through the RF amplifier and mixed through the frequency mixing circuit with a signal VLO supplied from the local oscillator and outputted as an IF output signal IFOUT. In FIG. 1, L1 to L4 are coils, T1 is an output transformer, C1 to C15 are capacitors, CV1 to CV3 are variable capacitors, C1A, C1B and C1C are ganged variable capacitors, VSS is a source voltage and VAGC is an AGC voltage.

In the conventional frequency mixing circuit as above, an output signal VRF of the RF amplifier is applied to one gate of the FET Q22 and the output signal VLO of the local oscillator is applied to the other gate thereof. The one gate of the FET Q22, namely, the gate applied with the output signal of the RF amplifier is additionally applied through a resistor R5 with a voltage obtained by dividing a power source voltage (−VSS) through a resistor R6 and a resistor R10. This is to set the gate voltage fixedly by an optimized direct current bias voltage thereby to control the conversion gain of the FET Q22.

In general, the gain of an FET is determined dependently on a transconductance gm and in turn, the transconductance gm is determined dependently on the gate voltage. Similarly, the transconductance gm of a dual gate FET is determined dependently on the voltages to be applied to the two gates thereof, which is monotonically changed with each of such gate voltages. As a result, the frequency mixing circuit in FIG. 1 makes it possible to provide an AGC function because the conversion gain can be changed with the voltage applied to one of the gates of the dual gate FET Q22.

With the frequency mixing circuit as shown in FIG. 1, the AGC function is realized by applying an optimized direct current bias voltage fixedly, thus raising a problem that the controllable range will be narrow. Then, as a modified example, such a frequency mixing circuit that the resistor R1 of the RF amplifier is disconnected from the power source voltage (−VSS) thereby to apply the AGC voltage VAGC to the open end of the resistor R1 as shown by the broken line in FIG. 1 is known as well. In this circuit, the level of the input signal VRF to the FET Q22 can be made variable with the AGC voltage VAGC and as a result, the level of the output signal of the FET Q22 of the frequency mixing circuit, namely, the level of an intermediate frequency output signal IFOUT will be made variable. In this case, however, a problem will arise such that the range where the AGC function is possibly performed is not enough.

In the frequency mixing circuit as shown in FIG. 1, in order to widen the range to perform the AGC function by controlling the gate voltage of the dual gate FET Q22, it is required that the voltage divider consisting of the resistors R6 and R10 is disconnected with the resistor R5 and the AGC voltage VAGC is applied to the open end of the resistor R5 as shown by the broken line in FIG. 1. In this case, however, two input signals are required thereby to make the operation complex and as a result, the operation will be made unstable because the intermodulation characteristic is changed from the optimum bias point when the AGC voltage is applied. Accordingly, there arises such a problem that it is difficult to realize a circuit for performing the AGC function by controlling the gate voltage of the dual gate FET Q22.

SUMMARY OF THE INVENTION

Therefore, an object of this invention is to provide a frequency mixing circuit capable of stably performing a wider range of AGC function than would be obtained by a conventional one.

In a first aspect of this invention, a frequency mixing circuit comprises first to fourth unbalanced differential pairs each composed of two transistors different in emitter area from each other and first to fourth transistors each for driving the corresponding one of the four differential pairs according to a common direct current voltage source.

In the four differential pairs, the collectors of the transistors smaller in emitter area are connected in common and the collectors of the transistors larger in emitter area are connected in common thereby to form an output terminals pair.

In the first and second differential pairs, the base of the transistor smaller in emitter area and the base of the transistor larger in emitter area are connected in common thereby to form a first input terminals pair, and in the third and fourth differential pairs, the base of the transistor smaller in emitter area and the base of the transistor larger in emitter area are connected in common thereby to form a second input terminals pair.

One terminal of the first input terminals pair and one terminal of the second input terminals pair are connected in common thereby to be applied with a first input signal voltage.

The other terminal of the first input terminals pair is applied with a first voltage obtained by halving an AGC voltage and the other terminal of the second input terminals pair is applied with a second voltage obtained by reversing in polarity the first voltage.

The bases of the first to fourth transistors are applied with a second input signal voltage.

In a second aspect of this invention, a frequency mixing circuit comprises, similar to the first aspect, first to fourth unbalanced differential pairs each composed of two transistors different in emitter area from each other, and first to fourth transistors each for driving the corresponding one of the four differential pairs according to a common direct current voltage source. In this aspect, however, the connection of the first to fourth unbalanced differential pairs is different from that of the first aspect.

In the frequency mixing circuit of this aspect, the collectors of the transistors larger in emitter area of the first and second differential pairs are connected in common, and the collectors of the transistors smaller in emitter area of the third and fourth differential pairs are connected in common thereby to form one terminal of an output terminals pair. Besides, the collectors of the transistors smaller in emitter area of the first and second differential pairs and the collectors of the transistors larger in emitter area of the third and fourth differential pairs are connected in common thereby to form the other terminal of the output terminals pair.

The base of the transistor larger in emitter area of the first differential pair and the base of the transistor smaller in emitter area of the fourth differential pair are connected in common thereby to be applied with a first voltage obtained by halving a first input signal voltage. The base of the transistor larger in emitter area of the second differential pair and the base of the transistor smaller in emitter area of the third differential pair are connected in common thereby to be applied with a second voltages obtained by reversing in polarity the first voltage.

The base of the transistor smaller in emitter area of the first differential pair and the base of the transistor larger in emitter area of the third differential pair are connected in common thereby to be applied with a third voltages obtained by halving an AGC voltage. The base of the transistor smaller in emitter area of the second differential pair and the base of the transistor larger in emitter area of the fourth differential pair are connected in common thereby to be applied with a fourth voltage obtained by reversing in polarity the third voltage.

The bases of the first to fourth transistors are applied with a second input signal voltage as in the first aspect.

With the frequency mixing circuits shown in the first and second aspects, the first input signal and AGC voltage are applied to the four unbalanced differential pairs and the second input signal is applied to the four transistors each for driving the corresponding one of the four differential pairs, so that a wide range of the AGC function can be provided stably.

In the frequency mixing circuits of the first and second aspects, the four unbalanced differential transistors pairs may be different in emitter area ratio from each other, but preferable to be equal to each other. In addition, as the first and second input signals, any signal may be used if it is a signal to be frequency-mixed, but an output signal of an RF amplifier and an output signal of a local oscillator are respectively used in general. In this case, it is preferable to use the output signal of an RF amplifier as the first input signal and the output signal of a local oscillator as the second input signal.

DESCRIPTION OF THE PREFERRED EMBODIMENTS

Figure 1:
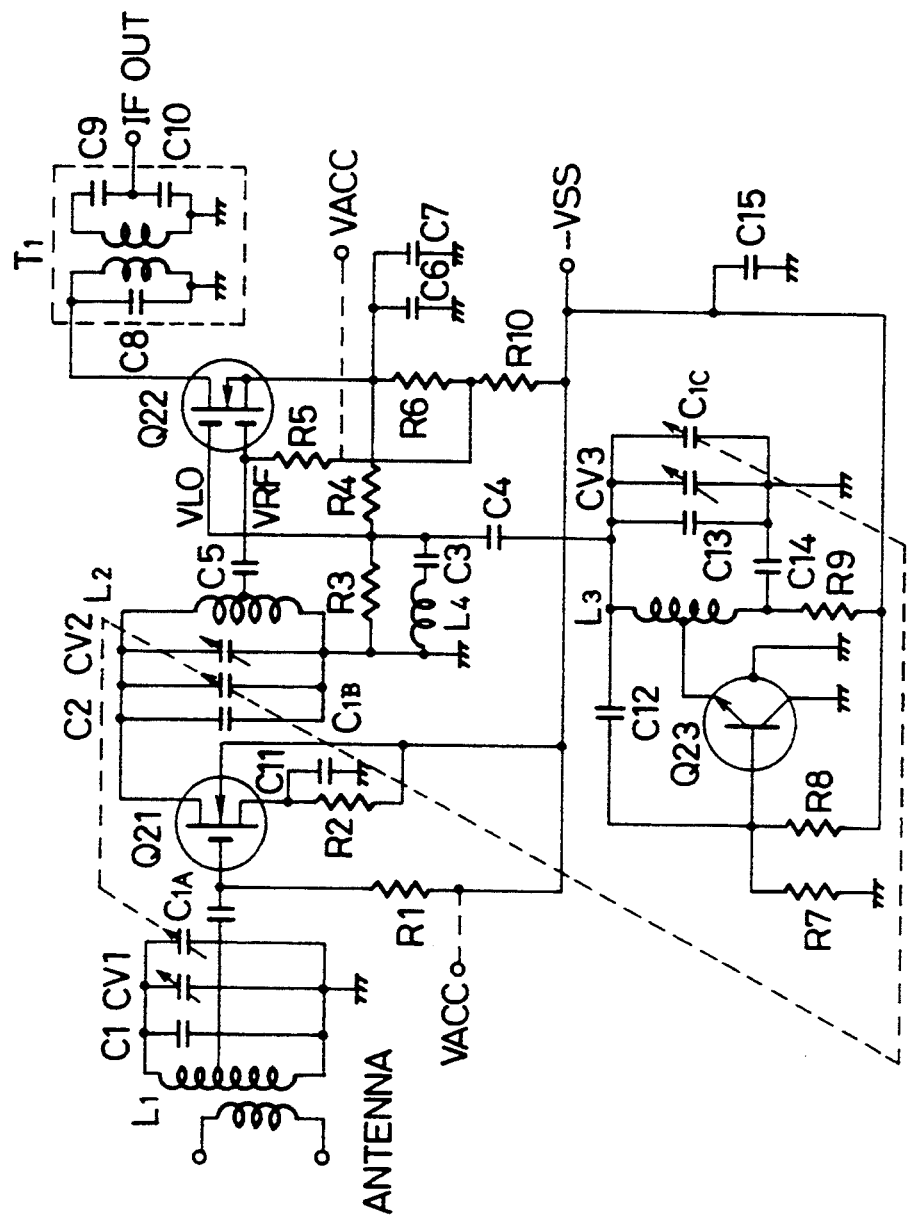
FIG. 1 shows a conventional frequency mixing circuit having an AGC function.

Preferred embodiments of this invention will be described below while referring to the drawings attached.

[First Embodiment]

Figure 2:
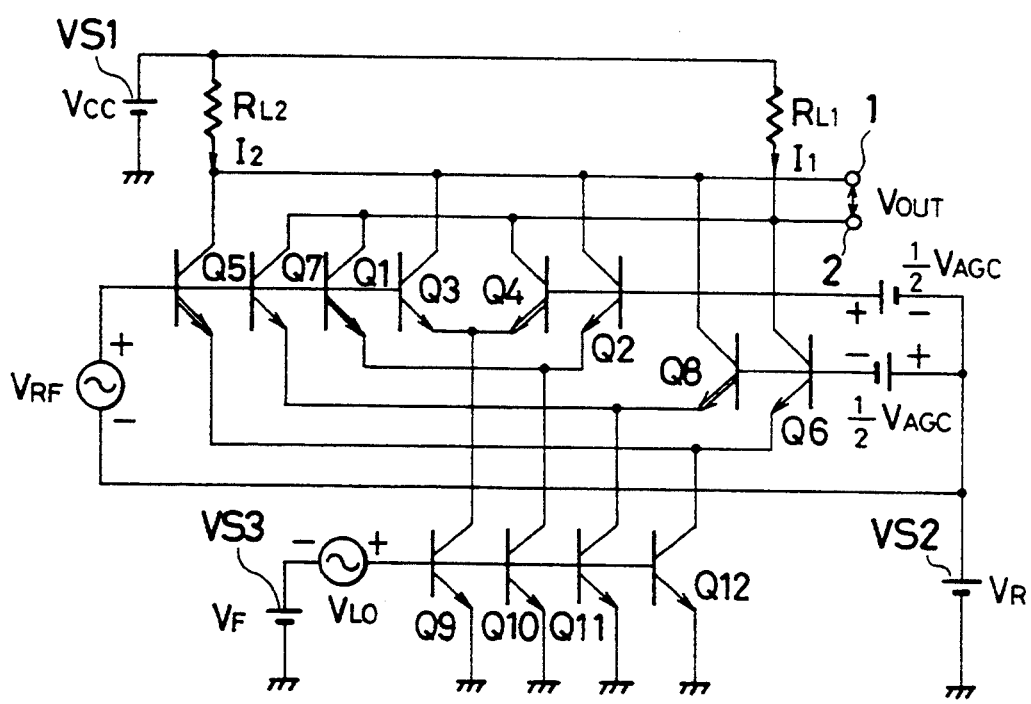
FIG. 2 shows a frequency mixing circuit according to a first embodiment of this invention.

FIG. 2 is a circuit diagram of a frequency mixing circuit according to a first embodiment of this invention, which comprises mainly a first unbalanced differential pair composed of transistors Q1 and Q2 which are different in emitter area from each other, a second unbalanced differential pair composed of transistors Q3 and Q4 which are different in emitter area from each other, a third unbalanced differential pair composed of transistors Q5 and Q6 which are different in emitter area from each other, a fourth unbalanced differential pair composed of transistors (Q7 and Q8 which are different in emitter area from each other, and four transistors Q9, Q10, Q11 and Q12 for correspondingly driving the first to fourth unbalanced differential transistor pairs.

The emitter area ratio of the transistors Q1 and Q2 forming the first unbalanced differential pair is K:1 (K>1), which means that if the emitter area of the transistor Q2 is made one (1), the emitter area of the transistor Q1 becomes K.

In this embodiment, similarly, the emitter area ratios of respective two transistors of the other unbalanced differential pairs are 1:K or K:1. Namely, in the second unbalanced differential transistors pair Q3 and Q4, if the emitter area of the transistor Q3 is made one (1), the emitter area of the transistor Q4 becomes K, in the third unbalanced differential transistors pair Q5 and Q6, if the emitter area of the transistor Q6 is made one (1), the emitter area of the transistor Q5 becomes K, and in the fourth unbalanced differential transistors pair Q7 and 08, if the emitter area of the transistor Q7 is made one (1), the emitter area of the transistor Q8 becomes K.

These four unbalanced differential pairs are connected with each other as follows:

The collectors of the transistors Q2 and Q3 smaller in emitter area of the first and second differential pairs are connected in common as well as connected to a direct current voltage source VS1 (voltage VCC) through a load resistor RL2 (resistance RL) on the one side and to a terminal 1 forming an output terminals pair on the other side. The collectors of the transistors Q6 and Q7 smaller in emitter area of the third and fourth differential pairs are connected in common as well as connected to the voltage source VS1 through a load resistor RL1 (resistance RL) on the one side and to a terminal 2 forming the output terminals pair on the other side.

The collectors of the transistors Q1 and Q4 larger in emitter area of the first and second differential pairs are connected in common as well as connected to the voltage source VS1 through the resistor RL1 on the one side and to the terminal 2 forming the output terminals pair on the other side. The collectors of the transistors Q5 and Q8 larger in emitter area of the third and fourth differential pairs are connected in common as well as connected to the direct current voltage source VS1 through the resistor RL2 on the one side and to the terminal 1 forming the output terminals pair on the other side.

Namely, the collectors of the transistors Q2, Q3, Q5 and (Q8 are connected through the load resistor RL2 to the voltage source VS1 as well as connected to the terminal 1 forming the output terminals pair. The collectors of the transistors Q1, Q4, Q6 and Q7 are connected through the load resistor RL1 to the voltage source VS1 as well as connected to the terminal 2 forming the output terminals pair.

In the first and second unbalanced differential pairs, the base of the transistor Q3 smaller in emitter area and the base of the transistor Q1 larger in emitter area are connected in common, and the base of the transistor Q4 larger in emitter area and the base of the transistor Q2 smaller in emitter area are connected in common, which constitute a first input terminals pair.

Similarly, in the third and fourth unbalanced differential pairs, the base of the transistor Q7 smaller in emitter area and the base of the transistor Q5 larger in emitter area are connected in common, and the base of the transistor Q8 larger in emitter area and the base of the transistor Q6 smaller in emitter area are connected in common, which constitute a second input terminals pair.

One terminal of the first input terminals pair, that is, the common base of the transistors Q3 and Q1, and one terminal of the second input terminals pair, that is, the common base of the transistors Q7 and Q5, are further connected in common. The common base thus formed by connecting the bases of these four transistors is applied with an output voltage VRF of an RF amplifier as a first input signal.

The other terminal of the first input terminals pair, that is, the common base of the transistors Q4 and Q2 is applied with a first voltage obtained by halving the AGC voltage VAGC. The other terminal of the second input terminals pair, that is, the common base of the transistors Q8 and Q6 is also applied with a second voltage obtained by reversing in polarity the first voltage. As shown in FIG. 2, the positive polarity voltage $+(\frac{1}{2})$VAGC is applied to the common base of the transistors Q4 and Q2 and on the other hand, the negative polarity voltage $-(\frac{1}{2})$VAGC is applied to the common base of the transistors Q8 and Q6.

The common base of the transistors Q3, Q1, Q7 and Q5 and the common base of the transistors Q4 and Q2, and the common base of the transistors Q8 and Q6 are connected in common to a direct current voltage source VS2 (voltage VR). As a result, the voltage VRF as the first input signal and the voltages $+(\frac{1}{2})$VAGC and $-(\frac{1}{2})$VAGC are applied additionally to the voltage VR of the voltage source VS2.

The two transistors of each of the first to fourth differential pairs have their emitters connected in common, which means that so-called unbalanced emitter-coupled differential pair is provided. The common emitter of each differential pair is connected to the corresponding one of the collectors of the transistors Q9, Q10, Q11 and Q12 for driving the differential pairs. Namely, the emitters of the transistors Q1 and Q2 of the first differential pair are connected in common to the collector of the transistor Q10, the emitters of the transistors Q3 and Q4 of the second differential pair are connected in common to the collector of the transistor Q9, the emitters of the transistors Q5 and Q6 of the third differential pair are connected in common to the collector of the transistor Q12, and the emitters of the transistors Q7 and Q8 of the fourth differential pair are connected in common to the collector of the transistor Q11.

The bases of the transistors Q9, Q10, Q11 and Q12 for the differential pair driving use are connected in common and the common base thus formed is connected to a direct current voltage source VS3 (voltage VF). These transistors Q9, Q10, Q11 and Q12 are energized by the voltage source VS3 to drive the corresponding one of the first to fourth differential pairs. The common base of the transistors Q9, Q10, Q11 and Q12 is applied with an output voltage VLO of a local oscillator as a second input signal additionally to the source voltage VF.

The first and second input signals VRF and VLO and the voltages $\pm(\frac{1}{2})$VAGC respectively have the polarities as shown in FIG. 2.

The operation of the frequency mixing circuit structured as above will be explained below.

First, an emitter current IE of a transistor can be expressed in terms of the saturation current IS, Boltzmann's constant k, absolute temperature T, unit electron charge q, and base-to-emitter voltage VBE, as $$IE = IS\{\exp(q \cdot VBE/kT) - 1\}$$

Here, if $VT = kT/q$, $VBE > VT$ and as $\exp(VBE/VT) \gg 1$, so that the emitter current IE can be approximated as follows:

$$IE \approx IS \cdot \exp(q \cdot VBE/VT)$$

In this embodiment, the four transistors Q9, Q10, Q11 and Q12 respectively have the collector currents IC9, IC10, IC11 and IC12 which are equal to each other, as $$IC9 = IC10 = IC11 = IC12 = IL0$$

In addition, $$IL0 \approx IS \cdot \exp\{(VF + VLO)/VT\}$$

Here, if IS exp(VF/VT) is expressed as IO, it is a direct current, so that the following can be obtained, as $$IL0 = IO \cdot \exp(VLO/VT)$$

Next, in the first unbalanced differential pair, the emitter area ratio of the composing transistors Q1 and Q2 is K:1, so that if the DC common-base current gain factor is expressed as αF, the collector currents IC1 and IC2 of the transistors Q1 and Q2 can be respectively expressed as follows:

$$IC1 = \alpha F \cdot IL0 / \{1 + (1/K19) \exp(-VRF/VT)\} \quad (1)$$

$$IC2 = \alpha F \cdot IL0 / \{1 + K \cdot \exp(VRF/VT)\} \quad (2)$$

In equations (1) and (2), $$IC1 + IC2 = \alpha F \cdot IL0$$

And if K as a factor showing the emitter area ratio is expressed as $VK = VT \cdot \ln K$, it can be determined as $$K = \exp(VK/VT)$$

Thus, by eliminating K from equations (1) and (2), the collector currents IC1 and IC2 can be expressed as follows:

$$IC1 = \frac{\alpha F \, ILO}{1 + \exp\left[-\dfrac{\{VRF - (1/2)VAGC + VK\}}{VT}\right]} \quad (3)$$

$$IC2 = \frac{\alpha F \, ILO}{1 + \exp\left[\dfrac{\{VRF - (1/2)VAGC + VK\}}{VT}\right]} \quad (4)$$

As a result, the differential current ΔI1 between the collector currents IC1 and IC2, or (IC1−IC2) can be expressed as follows:

$$\Delta I1 = IC1 - IC2 = \quad (5)$$

$$\alpha F \cdot ILO \cdot \tanh\left[\dfrac{\{VRF - (1/2)VAGC + VK\}}{2VT}\right]$$

In the second unbalanced differential pair, similarly, the differential current $\Delta I2$ of respective collector currents IC3 and IC4 of the transistors Q3 and Q4, or (IC3-IC4) can be expressed as follows:

$$\Delta I2 = IC3 - IC4 = \quad (6)$$

$$\alpha F \cdot ILO \cdot \tanh\left[\frac{\{VRF - (1/2)VAGC - VK\}}{2VT}\right]$$

As a result, the difference between the differential currents $\Delta I1$ and $\Delta I2$, or ($\Delta I1-\Delta I2$) can be shown as follows:

$$\begin{aligned}\Delta I1 - \Delta I2 &= (IC1 - IC2) - (IC3 - IC4) \quad (7)\\ &= \alpha F \cdot ILO \cdot \\ &\quad \left(\tanh\left[\frac{\{VRF - (1/2)VAGC + VK\}}{2VT}\right] - \right.\\ &\quad \left.\tanh\left[\frac{\{VRF - (1/2)VAGC - VK\}}{2VT}\right]\right)\end{aligned}$$

When $|x|<1$, $\tanh x$ can be expanded in series as follows:

$$\tanh x = x - (1/3)x^3 \ldots (|x|<1) \quad (8)$$

Accordingly, when $|VRF-(1/2)VAGC\pm VK|<2VT$, equation (7) can be expressed as follows:

$$\begin{aligned}\Delta I1 - \Delta I2 &= \alpha F \cdot ILO\left(\left[\frac{\{VRF - (1/2)VAGC + VK\}}{2VT}\right] -\right.\\ &\quad (1/3)\left[\frac{\{VRF - (1/2)VAGC + VK\}}{2VT}\right]^3 \ldots -\\ &\quad \left[\frac{\{VRF - (1/2)VAGC - VK\}}{2VT}\right] +\\ &\quad \left.(1/3)\left[\frac{\{VRF - (1/2)VAGC - VK\}}{2VT}\right]^3 \ldots\right)\\ &= \alpha F \cdot ILO[(VK/VT) - [VK/\{4(VT)^3\}] \cdot \\ &\quad \{VRF - (1/2) \cdot VAGC\}^2 -\\ &\quad (2/3)\cdot(VK/2VT)^3 \ldots]\end{aligned} \quad (9)$$

In the third unbalanced differential pair, similarly, the differential current $\Delta I3$ of respective collector currents IC5 and IC6 of the transistors Q5 and Q6, or (IC5-IC6) can be expressed as follows:

$$\Delta I3 = IC5 - IC6 = \quad (10)$$

$$\alpha F \cdot ILO \cdot \tanh\left[\frac{\{VRF + (1/2)VAGC + VK\}}{2VT}\right]$$

In the fourth unbalanced differential pair, further similarly, the differential current $\Delta I4$ of respective collector currents IC7 and IC8 of the transistors Q7 and Q8, or (IC7-IC8) can be expressed as follows:

$$\Delta I4 = IC7 - IC8 = \quad (11)$$

$$\alpha F \cdot ILO \cdot \tanh\left[\frac{\{VRF + (1/2)VAGC - VK\}}{2VT}\right]$$

As a result, the difference between the differential currents $\Delta I3$ and $\Delta I4$, or ($\Delta I3-\Delta I4$) can be shown as follows:

$$\begin{aligned}\Delta I3 - \Delta I4 &= \alpha F \cdot ILO[(VK/VT) - [VK/\{4(VT)^3\}] \cdot \quad (12)\\ &\quad \{VRF + (1/2) \cdot VAGC\}^2 - (2/3)\cdot(VK/2VT)^3 \ldots ]\end{aligned}$$

Therefore, the differential current $\Delta I$ of the differential output currents I1 and I2 of this circuit (see FIG. 2) can be expressed as follows:

$$\begin{aligned}\Delta I &= I1 - I2\\ &= (IC1 + IC4 + IC6 + IC7) -\\ &\quad (IC2 + IC3 + IC5 + IC8)\\ &= (IC1 - IC2) - (IC3 - IC4) - (IC5 - IC6) +\\ &\quad (IC7 - IC8)\\ &= (\Delta I1 - \Delta I2) - (\Delta I3 - \Delta I4)\end{aligned}$$

Hence, from equations (9) and (12), the following equation can be obtained as:

$$\begin{aligned}\Delta I &= \alpha F \cdot ILO \cdot [VK/\{2(VT)^3\}] \cdot VRF \cdot VAGC \ldots \quad (13)\\ &\approx \alpha F \cdot ILO \cdot [VK/\{2(VT)^3\}] \cdot VRF \cdot VAGC\end{aligned}$$

By substituting $IL0 \simeq IS \exp\{(VF+VLO)/VT\}$ into equation (13), the following equation can be obtained as:

$$\Delta I = \alpha F \cdot I0 \cdot [VK/\{2(VT)^3\}]\cdot VAGC\cdot VRF\cdot\exp(-VLO/VT) \quad (14)$$

Here, $\exp(\pm x)$ can be expanded in a series as $$\exp(\pm x) = 1 \pm x + (X^2/2) \pm \quad (15)$$

As a result, by expanding equation (14) in a series using equation (15), $\Delta I$ can be approximated as follows:

$$\begin{aligned}\Delta I &\approx \alpha F \cdot I0 \cdot [VK/\{2(VT)^3\}] \cdot VAGC \cdot VRF \times \quad (16)\\ &\quad \{1 + (VLO/VT) + (1/2)\cdot(VLO/VT)^2 + \ldots\}\\ &\approx \alpha F \cdot I0 \cdot [VK/\{2(VT)^3\}] \cdot VAGC \cdot VRF \cdot\\ &\quad \{1 + (VLO/VT)\}\end{aligned}$$

Here, by supposing that $$VRF = |VRF|\cdot\cos(2\pi\cdot fRF\cdot t)$$

$$VLO = |VLO|\cdot\cos(2\pi\cdot fLO\cdot t)$$

and substituting them into equation (16), the following equation can be obtained as:

$$\begin{aligned}\Delta I &= \alpha F \cdot I0 \cdot [VK/\{2(VT)^3\}] \cdot VAGC \cdot [|VRF| \cdot \quad (17)\\ &\quad \cos(2\pi\cdot fRF\cdot t) + \{(|VRF|\cdot|VLO|)/VT\}\cdot\\ &\quad \cos(2\pi\cdot fRF\cdot t)\cdot\cos(2\pi\cdot fLO\cdot t)]\\ &= \alpha F \cdot I0 \cdot [VK/\{2(VT)^3\}] \cdot VAGC \cdot |VRF| \cdot\\ &\quad \cos(2\pi\cdot fRF\cdot t) + [(VK\cdot\alpha F\cdot I0\cdot |VRF|\cdot\\ &\quad |VLO|)/4\{VT\}^4]\cdot VAGC\cdot\cos\{2\pi(fRF+fLO)t\}\\ &\quad +\\ &\quad [(VK\cdot\alpha F\cdot I0\cdot|VRF|\cdot VLO|)/4\{VT\}^4]\cdot\\ &\quad VAGC\cdot\cos\{2\pi(fRF-fLO)t\}\end{aligned}$$

From equation (17), it can be found that the differential current $\Delta I$ of the currents I1 and I2 contains the components of the sum and difference of the frequency fRF of the voltage VRF and the frequency fLO of the voltage VLO, so that the circuit shown in FIG. 2 has a frequency mixing function.

The output voltage VOUT of this circuit can be obtained in terms of the resistance RL of the load resistors RL1 and RL2, as $$VOUT = \Delta I \cdot RL$$

Therefore, by removing undesired waves of the output voltage VOUT through a filter, an IF voltage VIF having the frequency component of (fRF+fLO) or |fRF−fLO| can be obtained.

Here, |VIF| showing the crest value of the IF voltage VIF can be expressed as follows:

$$|VIF| = [(VK \cdot \alpha F \cdot IO \cdot |VRF| \cdot |VLO| \cdot RL) / \{4(VT)^4 \cdot LFIL\}] \cdot VAGC \quad (18)$$

From equation (18), it can be found that the voltage VIF is proportional to the AGC voltage VAGC and that the circuit shown in FIG. 2 becomes a frequency mixing circuit having an AGC function. In equation (18), LFIL is an insertion loss of a filter.

As explained above, in the frequency mixing circuit of the first embodiment, four unbalanced differential pairs are applied with the output voltage VRF of the RF amplifier as the first input signal and with the halved voltages $+(\frac{1}{2})$VAGC and $-(\frac{1}{2})$VAGC of the AGC voltage and the input terminal of the transistors Q9, Q10, Q11 and Q12 for the corresponding differential pair driving use is additionally applied with the output voltage VLO of the local oscillator as the second input signal, so that a wide range of the AGC function can be provided stably.

[Second Embodiment]

Figure 3:
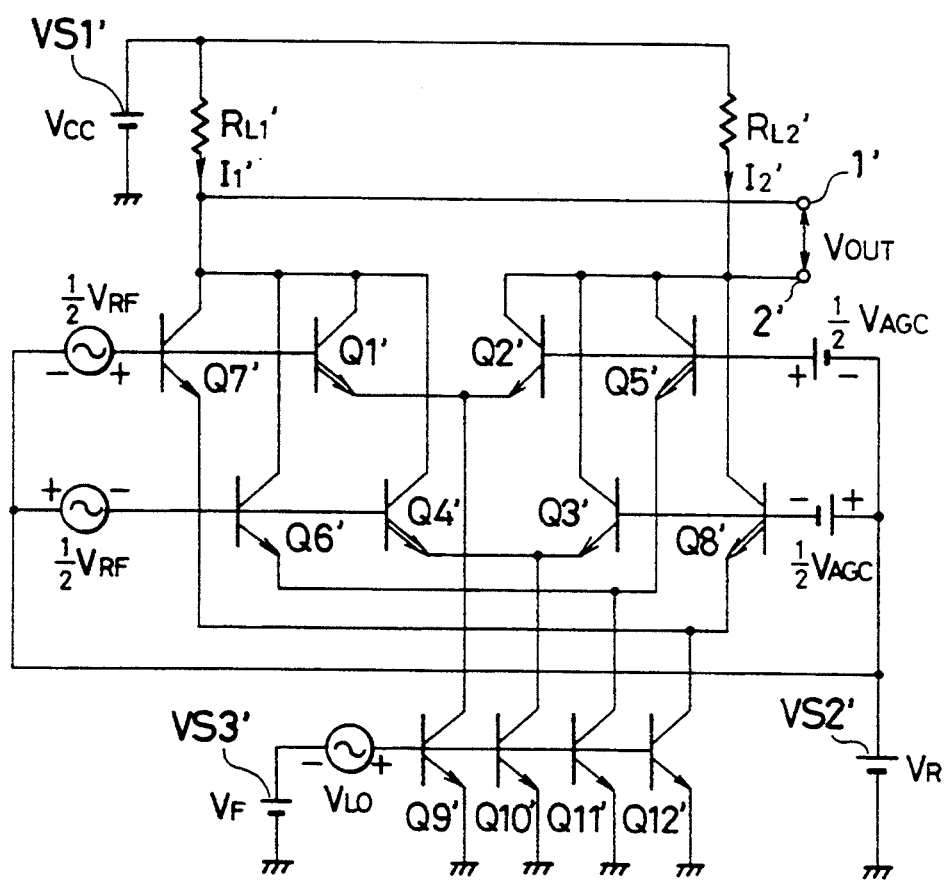
FIG. 3 shows a frequency mixing circuit according to a second embodiment of this invention.

FIG. 3 is a circuit diagram of a frequency mixing circuit according to a second embodiment of this invention, which is different from the first embodiment in that first to fourth unbalanced differential pairs are differently connected therefrom.

In FIG. 3, emitter area ratio of transistors Q1' and Q2', which form a first unbalanced differential pair, is K:1 (K>1). Emitter area ratio of transistors Q3' and Q4', which form a second unbalanced differential pair, is 1:K, emitter area ratio of transistors Q5' and Q6', which form a third unbalanced differential pair, is K:1, and emitter area ratio of transistors Q7' and Q8', which form a fourth unbalanced differential pair, is 1:K. Each of these four differential pairs is driven by the corresponding one of transistors Q9', Q10', Q11' and Q12'.

The mutual connections of the four unbalanced differential pairs will be explained below.

The collectors of the respective transistors Q1' and Q4' larger in emitter area of the first and second differential pairs are connected in common as well as connected to a direct current voltage source VSI' (voltage VCC) through a load resistor RL1' (resistance RL) on the one side and to a terminal 1' forming an output terminals pair on the other side. The collectors of the respective transistors Q2' and Q3' smaller in emitter area of the first and second differential pairs are connected in common as well as connected to the voltage source VSI' through a load resistor RL2' (resistance RL) on the one side and to a terminal 2' forming the output terminals pair on the other side.

The collectors of the respective transistors Q6' and Q7' smaller in emitter area of the third and fourth differential pairs are connected in common as well as connected to the voltage source VSI' through the load resistor RLi' on the one side and to the terminal 1' forming the output terminals pair on the other side. The collectors of the respective transistors Q5' and Q8' larger in emitter area of the third and fourth differential pairs are connected in common as well as connected to the voltage source VSI' through the load resistor RL2' on the one side and to the terminal 2' forming the output terminals pair on the other side.

The base of the transistor QI' larger in emitter area of the first differential pair and the base of the transistor Q7' smaller in emitter area of the fourth differential pair are connected in common to be applied with a first voltage obtained by halving the output voltage VRF of the RF amplifier as a first input signal. The base of the transistor Q4' larger in emitter area of the second differential pair and the base of the transistor Q6' smaller in emitter area of the third differential pair are connected in common to be applied with a second voltage obtained by reversing in polarity the first voltage. As shown in FIG. 3, the positive polarity voltage $+(\frac{1}{2})$VRF is applied to the common base of the transistors Q1' and Q7', and the negative polarity voltage $-(\frac{1}{2})$VRF is applied to the common base of the transistors Q4' and Q6'.

The base of the transistor Q2' smaller in emitter area of the first transistor pair and the base of the transistor Q5' larger in emitter area of the third transistor pair are connected in common to be applied with a third voltage obtained by halving the AGC voltage VAGC. The base of the transistor Q3' smaller in emitter area of the second differential pair and the base of the transistor Q8' larger in emitter area of the fourth differential pair are connected in common to be applied with a fourth voltage obtained by reversing in polarity the third voltage. As shown in FIG. 3, the positive polarity voltage $+(\frac{1}{2})$VAGC is applied to the common base of the transistors Q2' and Q5', and the negative polarity voltage $-(\frac{1}{2})$VAGC is applied to the common base of the transistors Q3' and Q8'.

The common base of the transistors Q1' and Q7', common base of the transistors Q4' and Q6', common base of the transistors Q2' and Q5', and common base of the transistors Q3' and Q8' are connected further in common to a direct current voltage source VS2' (voltage VR). Similar to the first embodiment, the voltages $+(\frac{1}{2})$VRF and $-(\frac{1}{2})$VRF as the first input signal and the voltages $+(\frac{1}{2})$VAGC and $-(\frac{1}{2})$VAGC are respectively applied additionally to the voltage VR of the voltage source VS2'.

Even in this embodiment, similar to the preceding one, the emitters of the two transistors of each of the first to fourth differential pairs are connected in common, thus making the so-called unbalanced emitter-coupled differential pair. Each of the common emitters of the first to fourth differential pairs is connected to the collector of the corresponding one of the transistors Q9', Q10', Q11' and Q12' for the differential pair driving use.

The bases of the transistors Q9', Q10', Q11' and Q12' are connected in common to be applied with a direct current voltage source VS3' (voltage VF), thus the first to fourth differential transistors pairs are driven correspondingly in accordance with this common voltage source VS3'. The common base of the transistors Q9', Q10', Q11' and Q12' is applied with the output voltage VLO of the local oscillator as a second input signal additionally to the source voltage VF. This is the same as in the first embodiment.

The polarities of the voltages $\pm(\frac{1}{2})$VRF, the voltage VL0, and the voltages $\pm(\frac{1}{2})$VAGC are as shown in FIG. 3.

In this embodiment, similar to the first embodiment, the differential current $\Delta I1'$ of the collector currents IC1' and IC2' of the transistors Q1' and Q2', the differential current $\Delta I2'$ of the collector currents IC3' and IC4' of the transistors Q3' and Q4', the differential current $\Delta I3'$ of the collector currents IC5' and IC6' of the transistors Q5' and Q6', and the differential current $\Delta I4'$ of the collector currents IC7' and IC8' of the transistors Q7' and Q8' can be respectively obtained as follows:

$$\Delta I1' = IC1' - IC2' \tag{19}$$
$$= \alpha F \cdot ILO \cdot \tanh\left[\frac{\{(1/2)VRF - (1/2)VAGC + VK\}}{2VT}\right]$$

$$\Delta I2' = IC3' - IC4' \tag{20}$$
$$= \alpha F \cdot ILO \cdot \tanh\left[\frac{\{(1/2)VRF - (1/2)VAGC - VK\}}{2VT}\right]$$

$$\Delta I3' = IC5' - IC6' \tag{21}$$
$$= \alpha F \cdot ILO \cdot \tanh\left[\frac{\{(1/2)VRF + (1/2)VAGC + VK\}}{2VT}\right]$$

$$\Delta I4' = IC7' - IC8' \tag{22}$$
$$= \alpha F \cdot ILO \cdot \tanh\left[\frac{\{(1/2)VRF + (1/2)VAGC - VK\}}{2VT}\right]$$

As a result, the differential current $\Delta I'$ of the differential output currents I1' and I2' (see FIG. 3) of this embodiment can be obtained as follows:

$$\Delta I' = I1' - I2' \tag{23}$$
$$= (IC1' + IC4' + IC6' + IC7') -$$
$$\quad (IC2' + IC3' + IC5' + IC8')$$
$$= (\Delta I1' - \Delta I2') - (\Delta I3' - \Delta I4')$$
$$= \alpha F \cdot ILO \cdot [VK/\{4(VT)^3\}] \cdot VRF \cdot VAGC$$

Compared with equation (13), it can be found that equation (23) is equal in format to equation (13) and the coefficient only becomes half that of equation (13). As a result, similar to the explanations of the preceding embodiment following equation (13), the frequency mixing circuit of the second embodiment makes it possible to obtain an output signal proportional to the AGC voltage VAGC.

As described above, with the frequency mixing circuit of the second embodiment, a wide range of AGC function can also be stably obtained.

What is claimed is:

1. A frequency mixing circuit comprising:
   first, second, third and fourth unbalanced differential pairs each composed of two transistors different in emitter area from each other;
   first, second, third and fourth transistors each for driving a corresponding one of said four unbalanced differential pairs in accordance with a common direct current voltage source, each of said first, second, third and fourth transistors being operatively connected to said corresponding one of said first, second, third and fourth differential pairs;
   in said four unbalanced differential pairs, collectors of said transistors smaller in emitter area being connected in common, and collectors of said transistors larger in emitter area being connected in common thereby to collectively form a pair of output terminals;
   in said first and second differential pairs, a base of a transistor smaller in emitter area of one of said first and second differential pairs and a base of a transistor larger in emitter area of a different one of said first and second differential pairs being connected in common to form one terminal of a first pair of input terminals and a base of a transistor larger in emitter area of one of said first and second differential pairs and a base of a transistor smaller in emitter area of a different one of said first and second differential pairs being connected in common to form another terminal of a first pair of input terminals, and in said third and fourth unbalanced differential pairs, a base of a transistor smaller in emitter area of one of said first and second differential pairs and a base of a transistor larger in emitter area of a different one of said first and second differential pairs being connected in common to form one terminal of a second pair of input terminals and a base of a transistor larger in emitter area of one of said first and second differential pairs and a base of a transistor smaller in emitter area of a different one of said first and second differential pairs being connected in common to form another terminal of a first pair of input terminals, and one terminal of said first pair of input terminals and one terminal of said second pair of input terminals being connected in common thereby to be provided a first input signal voltage;
   the other terminal of said first pair of input terminals being provided a first voltage obtained by halving an AGC voltage and the other terminal of said second pair of input terminals being provided a second voltage obtained by reversing in polarity said first voltage; and
   bases of said first, second, third and fourth transistors being provided a second input signal voltage.

2. The frequency mixing circuit as claimed in claim 1, wherein emitters of said two transistors of each of said first, second, third and fourth unbalanced differential pairs are connected in common.

3. The frequency mixing circuit as claimed in claim 1, wherein said first input signal voltage is an output signal of an RF amplifier and said second input signal voltage is an output signal of a local oscillator.

4. The frequency mixing circuit as claimed in claim 1, wherein emitter area ratios of said respective two transistors of said first, second, third and fourth unbalanced differential pairs are equal to each other.

5. The frequency mixing circuit as claimed in claim 1, wherein the bases of said first, second, third and fourth transistors are connected in common.

6. The frequency mixing circuit as claimed in claim 1, wherein each load resistor of two load resistors is connected to a respective terminal of said pair of output terminals and supplied with a corresponding one of differential output currents.

7. The frequency mixing circuit as claimed in claim 6, wherein said two load resistors are equal in resistance to each other.

8. A frequency mixing circuit comprising:

first, second, third and fourth unbalanced differential pairs each composed of two transistors different in emitter area from each other;

first, second, third and fourth transistors each for driving a corresponding one of said four unbalanced differential pairs in accordance with a common direct current voltage source, each of said first, second, third and fourth transistors being operatively connected to said corresponding one of said first, second, third and fourth differential pairs;

collectors of said transistors larger in emitter area of said first and second differential pairs being connected in common and collectors of said transistors smaller in emitter area of said third and fourth differential pairs being connected in common thereby to collectively form one terminal of a pair of output terminals;

collectors of said transistors smaller in emitter area of said first and second differential pairs being connected in common and collectors of said transistors larger in emitter area of said third and fourth differential pairs being connected in common thereby to collectively form another terminal of the pair of output terminals;

a base of said transistor larger in emitter area of said first differential pair and a base of said transistor smaller in emitter area of said fourth differential pair being connected in common thereby to be provided a first voltage obtained by halving a first input signal voltage and a base of said transistor larger in emitter area of said second differential pair and a base of said transistor smaller in emitter area of said third differential pair being connected in common thereby to be provided a second voltage obtained by reversing said first voltage;

a base of said transistor smaller in emitter area of said first differential pair and a base of said transistor larger in emitter area of said third differential pair being connected in common thereby to be provided a third voltage obtained by halving an AGC voltage, and a base of said transistor smaller in emitter area of said second differential pair and a base of said transistor larger in emitter area of said fourth differential pair are connected in common thereby to be provided a fourth voltage obtained by reversing in polarity said third voltage, and bases of said first, second, third and fourth transistors being provided a second input signal voltage.

9. The frequency mixing circuit as claimed in claim 8, wherein emitters of said transistors of each of said four unbalanced differential pairs are connected in common.

10. The frequency mixing circuit as claimed in claim 8, wherein said first input signal voltage is an output signal of an RF amplifier and said second input signal voltage is an output signal of a local oscillator.

11. The frequency mixing circuit as claimed in claim 8, wherein emitter area ratios of said respective two transistors of said four unbalanced differential pairs are equal to each other.

12. The frequency mixing circuit as claimed in claim 8, wherein bases of said first, second, third and fourth transistors are connected in common.

13. The frequency mixing circuit as claimed in claim 8, wherein each load resistor of two load resistors is connected to a respective terminal of said pair of output terminals pair and supplied with the corresponding one of differential output currents.

14. The frequency mixing circuit as claimed in claim 13, wherein said two load resistors are equal in resistance to each other.

* * * * *